United States Patent [19]

Bruel

[11] 4,370,176
[45] Jan. 25, 1983

[54] PROCESS FOR FAST DROPING OF SEMICONDUCTORS

[75] Inventor: Michel Bruel, Veurey-Voroize, France

[73] Assignee: Commissariat a l'Energie Atomique, Paris, France

[21] Appl. No.: 227,763

[22] Filed: Jan. 23, 1981

[30] Foreign Application Priority Data

Feb. 1, 1980 [FR] France .................... 80 02239

[51] Int. Cl.³ .................... H01L 21/263; H01J 37/30; H01J 27/00
[52] U.S. Cl. .................... 148/1.5; 148/187; 250/492.2; 357/91
[58] Field of Search .................... 148/1.5, 187; 357/91; 250/492 A

[56] References Cited
U.S. PATENT DOCUMENTS

| | | | |
|---|---|---|---|
| 3,999,072 | 12/1976 | Takagi | 250/427 |
| 4,021,675 | 5/1977 | Shifrin | 250/492 A |
| 4,035,655 | 7/1977 | Guernet et al. | 250/492 A |
| 4,086,108 | 4/1978 | Gohda | 148/175 |
| 4,120,700 | 10/1978 | Morimoto | 148/1.5 |
| 4,158,141 | 6/1979 | Seliger et al. | 250/492 A |
| 4,187,124 | 2/1980 | Muller et al. | 148/1.5 |
| 4,260,897 | 4/1981 | Bakker et al. | 250/492 A |

FOREIGN PATENT DOCUMENTS 144481 10/1980 Fed. Rep. of Germany .
1373822 8/1964 France .

OTHER PUBLICATIONS

Hodgson, IBM-TDB, 23 (Jun. 1980), 373.
Tsaur et al, Appl. Phys. Letts. 34 (1979) 168.
ION Implantation, eds. Dearnaley et al, North-Holland, Amsterdam, 1973, pp. 421–427.
Nagel, D. J., IEEE Trans. Nucl. Science, NS-26 (1), (1979), 1228.
IBM Technical Disclosure Bulletin, vol. 16, No. 8, Jan. 1974, New York, G. L. Hutchins: "Localized Semiconductor Diffusions Utilizing Local Laser Melting in doping atmospheres", p. 2585.

*Primary Examiner*—Upendra Roy
*Attorney, Agent, or Firm*—Oblon, Fisher, Spivak, McClelland & Maier

[57] ABSTRACT

The present invention relates to a process for fast doping of semiconductors, consisting in implanting foreign particles in a substrate and in rendering them electrically active so as to modify the physical properties of said substrate, wherein the foreign particles constituting the dopant material arrive on the substrate closely in time and space so that the energy brought by each particle when it is implanted in the substrate cooperates with the energy of the other particles so as to produce a local liquefaction of the substrate, allowing the particles to be positioned in the substitutional sites of the crystal lattice of the substrate and allowing said crystal lattice, which was disturbed when the particles penetrated in the substrate, to be rearranged.

16 Claims, 1 Drawing Figure

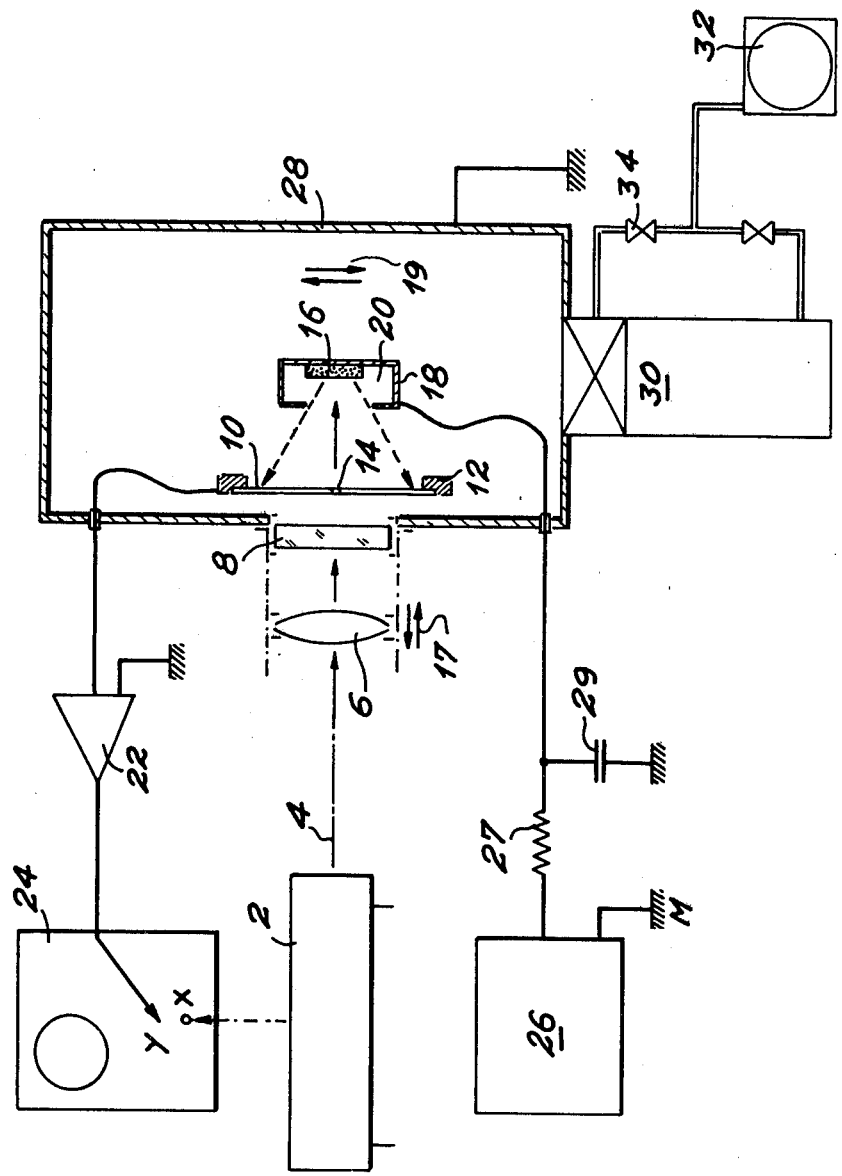

PROCESS FOR FAST DROPING OF SEMICONDUCTORS

BACKGROUND OF THE INVENTION

1. Field of the Invention

The present invention relates to a process for the fast doping of semiconductors.

2. Description of the Prior Art

It is known that doping of a semiconductor consists in implanting foreign particles, or impurities in a substrate, constituted by the semiconductor to be doped, and in rendering these impurities electrically active. The addition of impurities in a semiconductor enables the physical properties of said semiconductor to be modified. This semiconductor may be in the form of a single crystal and/or may already be doped.

The main applications of doped semiconductors are the manufacture of different components of the diode, transistor, thyristor, etc ... type and the manufacture of solar cells.

Several processes for doping semiconductors are known, such as for example, ion implantation, diffusion, epitaxial growth, alloying technique, etc .... The different processes of doping used depend on the impurities with which the semiconductor is doped, on the material constituting the latter and on the type of doping which it is desired to obtain.

In these different processes of doping, the addition of the impurities in the substrate is a slow process which generally lasts several hours, or at least several minutes. This is so, particularly in the case of the process of doping by ion implantation. This process of doping consists of two distinct steps:

The first step consists in implanting the substance by means of an ion or particle beam, the section of which is of the order of a $cm^2$ or $mm^2$. The point of impact of the particle or ion beam on the substrate moves so as to cover the whole surface of the substrate in homogeneous manner. This first step, or pre-deposit, it generally slow.

Studies have shown that two ions or particles never arrive at the same time on the substrate. Moreover, the variations between the instants of arrival between two particles cause the energy to dissipate progressively in the whole mass of the substrate. The heating produced when the particles penetrate in the substrate remains very little and cannot produce the effect of annealing necessary for rendering the impurities electrically active and to allow the crystal lattice which was disturbed during bombardment of the substrate by the particles or ions, to be rearranged. This annealing step constitutes the second step of this doping process. This annealing consists, for example, in taking the sample of the implanted substrate to different temperatures (between 0° and 1400° C.) for a variable length of time, which may be as much as several hours, in suitable furnaces.

For this second step, a so-called transitory annealing is also used, which consists in taking an energy density to the surface or to the level of the first implanted layers, for a very short time, so that very high temperatures are reached locally during this time. Studies have shown that the best results are generally obtained when the energy supply is sufficient to liquefy the first layers of the substrate.

Energy may be supplied in different manners and in particular with the aid of a light energy emitter means, for example a laser or a light flash, or pulsed electron beams.

This method of doping, by ion implantation, presents the drawback of consisting of two steps and, like all the other methods mentioned hereinabove, the different steps of the process are long.

It is therefore an object of the present invention to provide a process for the fast doping of semiconductors which enables these drawbacks to be overcome and, in particular, avoids the annealing phase by reducing the time for implantation of the particles or ions in the substrate.

SUMMARY OF THE INVENTION

According to the invention, this process of doping is characterised in that the foreign particles or impurities constituting the dopant material arrive on the substrate closely in time and space so that the energy brought by each particle when it is implanted in the substrate, cooperates with the energy of the other particles so as to produce a local liquefaction of the substrate, allowing the particles to be positioned in the substitutional sites of the crystal lattice of the substrate and allowing said crystal lattice, which was disturbed when the particles penetrated in the substrate, to be rearranged.

According to a first embodiment of the invention, the particles are on the substrate in the form of an ion beam which is intense and pulsed, i.e. which comprises a large number of particles each having high kinetic energy and sent in the form of pulses.

This pulsation of the beam may be obtained either on the whole by modulation of the source of ions in time, or at each point of the substrate by scanning in space of an intense continuous beam of small section.

According to a first variant, the ion beam is obtained from an interaction between a laser beam and a target constituted by dopant material.

According to a second variant, the ion beam is obtained with the aid of a plasma accelerator allowing the ion beam to focus and constituted by a cylindrical electrode, a filiform electrode coaxial with respect to this cylindrical electrode, means for applying a high voltage between these electrodes, means for making an electric discharge at one of the ends of the space between electrodes and means for introducing at this end a blast of gas, so that the electric discharge propagates towards the other end of the space between electrodes and creates a hot, dense plasma at this other end. This accelerator is generally known under the name of "Plasma-focus".

According to a third variant, the ion beam is obtained with the aid of a reflex triode source constituted by two cathodes placed on either side of an anode of small thickness allowing the electrons emitted by one of the cathodes to pass through said anode, the electrons then being reflected by the other cathode on the anode constituted of dopant material.

According to a fourth variant, the ion beam is obtained with the aid of a diode constituted by a cathode and an anode placed in a magnetic field perpendicular to the electric field created between the cathode and the anode made of dopant material. This magnetic field makes it possible to reflect the electrons emitted by the cathode on said cathode and to promote extraction of the ions from the anode, these ions being only slightly deflected by said magnetic field.

According to a fifth variant, the plasma is obtained with the aid of a diode constituted by a cathode which emits electrons, these electrons are picked up by an anode of rounded shape and constituted by the dopant material, the interaction of the electrons with the anode allowing the production of the ion beam which is focused due to the very shape of said anode.

According to a sixth variant, the ion beam is obtained by a vacuum spark ionization source. A spark is developed between two electrodes of which one is constituted by the dopant material. The spark is supplied during its lifetime by a very intense current. This allows very intense ion beams to be generated.

According to a second embodiment of the invention, the particles on the substrate are in the form of a beam of polyatomic clusters, generally known as "clusters".

According to a first variant, the cluster beam is obtained from a solid, constituted by the dopant material, by a method of rapid desorption in vacuo.

According to a second variant, the cluster beam is obtained from impact of heavy atoms on a target constituted by dopant material.

According to a third variant, the cluster beam is obtained by a supersonic expansion of vapour through a nozzle in vacuo.

According to the invention, the particles are, in certain cases, accelerated with the aid of an electric field, enabling all or part of the energy necessary for the local liquefaction of the substrate, to be furnished.

According to the invention, the particles may, in other cases, be combined with another particle beam so as to supply additional energy necessary for the local liquefaction of the substrate. This additional particle beam may for example be an electron, photon, ion, etc ... beam.

This process of doping presents the advantage that it may be used for doping any type of semiconductors, using any type of dopant material. Moreover, the quantity of impurities introduced in the substrate may easily be controlled.

This method of doping is fast and is effected in only one step. The energy density necessary for carrying out the fast doping process so as to obtain local liquefaction of the substrate, depends on the material in which it is desired to implant the particles, on the length of time during which this energy is supplied to the substrate and on the depth of penetration of the particles, if the duration of energy supply is very short.

BRIEF DESCRIPTION OF THE DRAWINGS

The invention will be more readily understood on reading the following description with reference to the accompanying drawings, in which:

The single FIGURE shows a general diagram of a device for carrying out the doping process according to the invention.

DETAILED DESCRIPTION OF THE PREFERRED EMBODIMENTS

Referring now to the drawing, a laser 2 sends a light beam 4. This beam 4 is focused with the aid of convergent lenses 6, passes through a window 8 then a wafer 10, constituted by the material to be doped. This wafer is held fixed with the aid of two supports such as 12 and is provided with a hole 14 allowing passage of the laser beam 4. This beam reaches a target 16 constituted by the dopant material and placed in vacuo. This target 16 is a polished surface on which the point of impact of the laser beam 4 may move. Reference 17 indicates the possible displacement of the lens 6. This displacement makes it possible to modify the dimensions of the focusing spot on the target 16, which, for a minimum impact surface, enables a maximum power flux to be obtained. To adjust the focusing of the light beam 4 from the laser 2, a secnd beam may be used, from a helium and neon gas laser (not shown).

In order to modify the point of impact of the beam 4 on the target 16, the target 16 may be moved continuously by any known means. The scanning of the target 16 by the displacement thereof is represented by reference 19. The bombardment of this target 16 with the aid of the beam 4 leads to the creation of a crater with vaporization and formation of an ion beam.

Of course, the ionization rate of the matter ejected from the target is as high as the power density supplied by the laser is high. To have an effective laser-matter interaction, power densities of between $10^{13}$ and $10^{17}$ W/m$^2$ must be supplied. It is thus possible to produce $10^{13}$ to $10^{18}$ ions in one laser "shot".

The extraction of the ion beam may be effected with the aid of an electric field, applied between the wafer 10 and the outer face 18 of an expansion vessel 20, when the latter is used, or directly between the wafer 10 of the material to be doped and the target 16 of dopant material. The ion beam, on impinging on the wafer 10, creates a current which is amplified with the aid of an amplifier 22. The signal obtained at the output of this amplifier 22 may be displayed on a memory oscilloscope 24, the time base of this oscilloscope being triggered by a synchronization signal furnished by the laser 2. This device enables the number of ions picked up by the wafer 10 at each test, or laser "shot", to be estimated.

The electric field allowing the extraction of the ions may be obtained with the aid of a supply source 26 supplying high D.C. voltage (of the order of 30 KV), connected to earth. This supply 26 may be connected to a protection resistor 27 and to a capacitor 29 serving as energy reservoir. The wafer 10 and the target 16 placed in the expansion vessel 20, are located in a vacuum chamber 28 connected to earth. The vacuum made in this chamber 28, of the order of $10^{-6}$ torr, is obtained for example with the aid of a diffusion pump 30 and a vane pump 32 connected together by valves such as 34.

For the fast doping described hereinabove to be possible, it is necessary to supply energy in a sufficiently short length of time for this energy supply to be adiabatic and for the transitory annealing to take place simultaneously to the implantation of the particles or ions in the substrate. In the case of implantation of particles in a substrate of silicon, the total energy density must be greater than a threshold of 0.5 J/cm$^2$, this energy density having to be supplied during a very short time, of the order of a few hundreds of nanoseconds. For these reasons, a ruby laser may for example be used, furnishing light pulses of 15 nanoseconds duration and carrying an energy of 0.5 Joule. Moreover, the use of a second laser beam of helium and neon allows a good focusing of this beam. A fine adjustment of the focusing of the laser and an adjustment of said laser allows a good optimization of the number of particles or impurities received by the wafer, constituted by the material to be doped. It is to be noted that only one laser "shot" is necessary for doping this wafer.

Moreover, in the case of a laser-matter interaction, at very high power density (beyond $10^{12}$ W/cm$^2$), it is possible to effect fast doping, without additional acceleration of the particles. In this case, the ion beam obtained is very energetic (energy ≧ 1 KeV) and the particles are very directive.

Depending on the case, pulsed ion beams or cluster beams are used. The use of the pulsed ion beams leads to doping at macroscopic level (a few thousands of Ångstroms to a few centimeters); on the other hand, the use of a cluster beam leads to doping at microscopic level (a few tens of Ångstroms to a few thousands of Ångstroms).

Macroscopic doping by pulsed ion beam presents two variants. In one, the beam is wide, immobile with respect to the substrate, and modulated in intensity; it allows doping of a large surface of substrate such as, for example, a whole wafer. In the other, the beam is narrow, of high current density, typically of 10 Å/cm$^2$, and the transitory character of the implantation and annealing is due to the short time of passage at each point of the wafer.

Macroscopic doping by ion beam is adapted to mass-productions where the tolerances of reproducibility are not too severe. Microscopic doping by cluster beam is much more flexible; it enables continuous beams of low density to be used and it is compatible with a real time control of the doping.

To effect doping at microscopic level, it suffices that the voluminal energy density supplied by a particle to be implanted is sufficient to liquefy a zone of the substrate by a few hundreds of Ångstroms, for example. For a cluster containing, for example, N atoms, it has been observed that the penetration of the cluster in the substrate is of the same order of size as that which corresponds to the isolated atom, of the same energy as each atom of the cluster, therefore the volume concerned by the supply of energy is of the same order of size. Consequently, the voluminal energy density supplied by the cluster to the substrate is multiplied by N. It suffices to choose N to be greater than a certain value to obtain the microscopic liquefaction of the substrate.

The formation of these clusters may be obtained either by a method of desorption in vacuo from a solid constituted by dopant material, or by impact of heavy atoms on a target constituted by dopant material, or by supersonic expansion of vapour through a nozzle in vacuo. A description of the different means for obtaining these cluster beams have been given in I.E.E.E. Transactions on Nuclear Sciences, volume NS 26, No. 1, which appeared in February 1979 in an article entitled "Production and impact effects of fast particles", pages 1232 to 1234.

In the case of using a cluster beam alone, the fact of impinging on the substrate with the aid of beams causes the dispersion of the atoms of the cluster when the latter penetrates in the substrate. On the other hand, when this beam is associated with a secondary beam (of electrons, photons, etc . . . ), the dispersion of the atoms of the cluster is obtained before they penetrate in the substrate. This enables the energy to be distributed in a larger volume of the substrate, and in more homogeneous manner.

The formation of an intense, pulsed ion beam may, of course, be obtained other than by means of the laser-matter interaction described hereinabove. This may be obtained, in particular, with the aid of a plasma accelerator, a reflex triode source, a diode of which the anode and the cathode may be in different forms, a vacuum spark ionization source, sources of ions of very high specific brilliance. A description of these different means for obtaining an ion beam, as well as functioning thereof, has been given in various publications, such as:

in I.E.E.E. Transactions on Nuclear Science, volume NS 26, No. 1, which appeared in February 1979, in an article entitled "Production and impact effects of fast particles", pages 1228 to 1234;

in Sov. Phys. Tech. Phys., which appeared on Sept. 23, 1978, in an article entitled "Technical applications of plasma accelerators", pages 1058 to 1064.

in the Proceedings of Fourth Conference on the Scientific and Industrial Applications of Small Accelerators, North Texas State University, from Oct. 27 to 29, 1976, in an article entitled: ¢Production of intense pulsed ion beams for near term applications", pages 203 to 214.

For carrying out the invention, the technique of ion collective acceleration may also be employed, which is described for example in the following articles which appeared in the I.E.E.E. Transactions on Nuclear Science, vol. NS 26, No. 3 which appeared in June 1979, entitled "Current Status of collective accelerators", pages 4156 to 4158 and "Experimental studies of heavy ion collective acceleration at the University of Maryland", pages 4177 to 4180.

This process for fast doping, in accordance with the invention, was carried out with the aid of a wafer of silicon, constituting the semiconductor to be doped, a boron ion beam for doping of type p and an antimony ion beam for doping of type n.

The number of ions implanted in a silicon wafer is $5.10^{14}$ per cm$^2$ for the boron dopant and $2.10^{14}$ per cm$^2$ for the antimony dopant. This measurement was carried out by neutron activation in the case of antimony and by means of an ion analyzer in the case of boron.

What is claimed is:

1. A process for fast doping of semiconductors consisting of implanting foreign particles in a substrate and in rendering said particles electrically active so as to modify the physical properties of said substrate, comprising the steps of:
    subjecting said substrate to a bombardment closely in time and space of said foreign particles constituting a dopant material wherein an energy brought by each particle when it is implanted in said substrate is adjusted so as to produce in cooperation with the other particles a local liquefaction of said substrate;
    allowing said particles to be positioned in substitutional sites of the crystal lattice of said substrate; and
    allowing said crystal lattice which was disturbed when said particles penetrated in said substrate, to be rearranged.

2. The doping process of claim 1, wherein the particles are, on the substrate, in the form of an intense, pulsed ion beam.

3. The doping process of claim 1, wherein the particles are sent onto the substrate in the form of a cluster beam.

4. The doping process of any one of claim 1, wherein the particles may be combined with another particle beam so as to supply additional energy necessary for the local liquefaction of the substrate.

5. The doping process of any one of claim 1, wherein the particles are accelerated with the aid of an electric field, enabling all or parts of the energy necessary for the local liquefaction of the substrate, to be furnished.

6. The doping process of claim 2, wherein the intense, pulsed beam is fixed with respect to the substrate and modulated in intensity.

7. The doping process of claim 2, wherein the intense pulsed beam is obtained at each point of the substrate by scanning of an intense continuous beam.

8. The doping process of any one of claims 2 to 7, wherein the ion beam is obtained from an interaction between a laser beam and a target constituted by the dopant material.

9. The doping process of any one of claims 2 to 7, wherein the ion beam is obtained with the aid of a plasma accelerator allowing the ion beam to focus and constituted by a cylindrical electrode, a filiform electrode coaxial with respect to this cylindrical electrode, means for applying a high voltage between these electrodes, means for making an electric discharge at one of the ends of the space between electrodes and means for introducing at this end a blast of gas, so that the electric discharge propagates towards the other end of the space between electrodes and creates a hot, dense plasma at this other end.

10. The doping process of any one of claims 2 to 7, wherein the ion beam is obtained with the aid of a reflex triode source constituted by two cathodes placed on either side of an anode of small thickness allowing the electrons emitted by one of the cathodes to pass through said anode, the electrons then being reflected by the other cathode on the anode constituted by dopant material.

11. The doping process of any one of claims 2 to 7, wherein the ion beam is obtained with the aid of a diode constituted by a cathode and an anode placed in a magnetic field perpendicular to the electric field created between the cathode and the anode constituted by dopant material.

12. The doping process of any one of claims 2 to 7, wherein the ion beam is obtained with the aid of a diode constituted by a cathode which emits electrons, these electrons are picked up by an anode of rounded shape and constituted by the dopant material, the interaction of the electrons with the anode allowing the production of the ion beam which is focused due to the very shape of said anode.

13. The doping process of any one of claims 2 to 7, wherein the ion beam is obtained by a vacuum spark ionization source, constituted by two electrodes between which a spark is produced, one of the electrodes being constituted by dopant material.

14. The doping process of claim 3, wherein the cluster beam is obtained from a solid constituted by the dopant material, by a method of rapid desorption in vacuo.

15. The doping process of claim 3, wherein the cluster beam is obtained from impact of heavy atoms on a target constituted by dopant material.

16. The doping process of claim 3, wherein the cluster beam is obtained by a supersonic expansion of vapour through a nozzle in vacuo.

* * * * *